United States Patent
Ivanenko et al.

(10) Patent No.: US 12,147,061 B2
(45) Date of Patent: Nov. 19, 2024

(54) TRANSFORMATION DEVICE FOR LASER RADIATION

(71) Applicant: LIMO DISPLAY GMBH, Dortmund (DE)

(72) Inventors: Mikhail Ivanenko, Essen (DE); Vyacheslav Grimm, Sankt Petersburg (RU); Henning Kalis, Dortmund (DE)

(73) Assignee: LIMO DISPLAY GMBH, Dortmund (DE)

( * ) Notice: Subject to any disclaimer, the term of this patent is extended or adjusted under 35 U.S.C. 154(b) by 423 days.

(21) Appl. No.: 17/621,828

(22) PCT Filed: Mar. 24, 2020

(86) PCT No.: PCT/EP2020/058186
§ 371 (c)(1),
(2) Date: Dec. 22, 2021

(87) PCT Pub. No.: WO2021/004661
PCT Pub. Date: Jan. 14, 2021

(65) Prior Publication Data
US 2022/0260759 A1    Aug. 18, 2022

(30) Foreign Application Priority Data
Jul. 8, 2019  (DE) .................. 102019118443.6

(51) Int. Cl.
*G02B 27/09* (2006.01)
*G02B 3/00* (2006.01)
(Continued)

(52) U.S. Cl.
CPC ............... *G02B 3/005* (2013.01); *G02B 5/10* (2013.01); *G02B 27/0927* (2013.01);
(Continued)

(58) Field of Classification Search
CPC .................................. G02B 27/0927
See application file for complete search history.

(56) References Cited

U.S. PATENT DOCUMENTS 7,782,535 B2    8/2010  Mikliaev et al.
8,270,084 B2 *  9/2012  Mikliaev ............ G02B 19/0095
                                              359/641
(Continued)

FOREIGN PATENT DOCUMENTS

EP    1006382 A1 *  6/2000  ......... G02B 19/0014
EP    1528425 A1     5/2005

OTHER PUBLICATIONS

EP1006382A1 English translation (Year: 2000).*

*Primary Examiner* — Charlie Y Peng
(74) *Attorney, Agent, or Firm* — IPro, PLLC

(57) ABSTRACT

Transformation device (1) for laser radiation (7), comprising a first array (2) of cylindrical lenses (3) arranged side by side in a first direction (x) and a second array (4) of cylindrical lenses (5) arranged side by side in the first direction (x), it being provided that during operation of the transformation device (1) the laser radiation (7) to be transformed first passes through the first array (2) and then through the second array (4), and wherein in each case one of the cylindrical lenses (3) of the first array (2) is associated with one of the cylindrical lenses (5) of the second array (4) in such a way that an array of reducing telescopes results, wherein the cylinder axes (6) of the cylindrical lenses (3) of the first array (2) enclose an angle (γ) greater than 45° and less than 90° with the first direction (x).

18 Claims, 3 Drawing Sheets

(51) Int. Cl.
*G02B 5/10* (2006.01)
*H01S 5/40* (2006.01)
*G02B 27/30* (2006.01)

(52) U.S. Cl.
CPC ..... *G02B 27/0961* (2013.01); *G02B 27/0966* (2013.01); *G02B 27/0983* (2013.01); *H01S 5/4025* (2013.01); *G02B 27/30* (2013.01)

(56) References Cited

U.S. PATENT DOCUMENTS

| | | | |
|---|---|---|---|
| 10,025,106 B2 * | 7/2018 | Mitra | G02B 5/045 |
| 2005/0063435 A1 * | 3/2005 | Imai | G02B 27/0955 |
| | | | 372/101 |
| 2006/0209310 A1 * | 9/2006 | Muenz | B23K 26/067 |
| | | | 356/521 |

* cited by examiner

TRANSFORMATION DEVICE FOR LASER RADIATION

TECHNICAL FIELD

The present invention concerns a transformation device for laser radiation according to the preamble of claim 1 or claim 1 and a laser device according to the preamble of claim 11.

BACKGROUND

For Flat Panel Display manufacturing ultra-violet (UV) Diode Pumped Solid State (DPSS) lasers have been established recently as reliable and low-maintenance laser sources. Here, Laser Lift Off (LLO), e.g. for flexible OLED displays, and annealing (i.e. crystallization of amorphous silicon layers) applications, e.g. for production of LTPS (Low Temperature Poly Silicon) thin film transistors, can be addressed with these types of sources. These lasers have a low pulse energy compared to other sources, such as Excimer Lasers, raising the need to create a tightly focused beam spot in the processing area. Furthermore, a homogeneous intensity distribution for uniform illumination of the workpiece is obligatory, to achieve a consistent product quality.

In the U.S. Pat. No. 7,782,535 a laser device with a laser light source and a transformation device for laser radiation is disclosed. The laser light source could be formed as a frequency-doubled Nd-YAG laser or as an excimer laser. The laser radiation emerging from the laser light source has for example a circular cross section and a beam quality factor $M_x^2 = M_y^2 = 4$ both in the x direction and in the y direction. The transformation device consists of two arrays of cylindrical lenses which together form an array of telescopes. The cylinder axes of the cylindrical lenses are inclined at an angle of 45° to the direction in which the cylindrical lenses are arranged side by side. This design ensures that the cross sections of the partial beams passing through the telescopes are mirrored relative to the axis of the cylindrical lenses. What can be achieved by such a design is that the beam quality factor with regard to one direction is significantly reduced and does not become much greater than 1, wherein the beam quality factor with regard to the other direction is increased relative to the state before the beam transformation. In the case of a beam quality factor of about 1 with regard to a direction perpendicular to the line, a very thin linear profile with a long depth of focus can thus be obtained. The fact that in this case the beam quality factor with regard to the longitudinal extent of the line is significantly increased at the same time does not prove to be disadvantageous since no or no high degree of focusing is desired in the longitudinal direction of the line. On the contrary, as a result of the increase in the beam quality factor in the longitudinal direction of the line, in general the spatial coherence and herewith light interference in this direction is also significantly reduced.

This beam transformation method is based on dividing the laser radiation into a plurality of partial beams. During the dividing process sharp intensity edges are created, that are in most realizations accompanied by illumination of intermediate zones between the cylindrical lenses. The light inclining on these zones leads to undesired energy losses, since the quality and shape of surface and coating in these areas are often technically limited and not well controlled. Moreover, the beam transformation device is usually designed as a telescopic system for well collimated entrance beams. However, this is in most cases fulfilled only for one direction. For the other direction the entrance beams may possess a noticeable divergency, which can lead to over-illumination of the lenses of the second array, and so to losses of the light.

A transformation device and a laser device of the type described at the beginning are known from EP 1 528 425 A1. The laser device described therein comprises a laser diode bar whose laser radiation is to be coupled into an optical fiber. The laser device further comprises a transformation device comprising two monolithic lens telescopes composed of four arrays of cylindrical lenses. The first two arrays, which lenses are oriented at 45° to the first direction, form a demagnifying Keppler telescope array. The third and fourth arrays, which lenses are oriented at −45° to the first direction, form a demagnifying Galileo telescope array. These two crossed telescopes mirror the cross-sections of the incoming beams relative to the axis of the cylindrical lenses and simultaneously reduce their cross-sections at the exit. The reduction in size is intended to prevent the laser beams emitted by the individual emitters of the laser diode bar from overlapping and allegedly improves focusing of the bar radiation.

However the beam sizes behind the first Keppler telescope are reduced only in one direction. For the perpendicular direction they are even extended and partially over-illuminate the cylindrical lenses of the second Galileo telescope array.

SUMMARY

The problem underlying the present invention is the creation of a transformation device and a laser device of the type mentioned above, in which the losses are reduced.

According to the invention, this is achieved by a transformation device of the aforementioned type with the characteristic features of claim 1 or claim 1 and a laser device of the aforementioned type with the characteristic features of claim 11. The dependent claims concern preferred embodiments of the invention.

According to claim 1, it is intended that the cylinder axes of the cylindrical lenses of the first array enclose an angle greater than 45° and less than 90° with the first direction. In this way, it is possible to at least partially prevent the laser radiation from hitting the spaces between the cylindrical lenses of the second array and neighboring lenses of the second array.

It may be provided that the cylinder axes of the cylindrical lenses of the second array are parallel to the cylinder axes of the cylindrical lenses of the first array. In particular, the cylinder axes of the cylindrical lenses of the first and/or second arrays may enclose an angle greater than 46° and less than 60° with the first direction. This angle range turns out to be advantageous for avoiding losses.

It is possible that all cylindrical lenses of the first array have the same focal lengths and/or the same radii of curvature and/or that all cylindrical lenses of the second array have the same focal lengths and/or the same radii of curvature. In particular, the focal lengths and radii of the cylindrical lenses of the second array are different from the focal lengths and radii of the cylindrical lenses of the first array.

It may be provided that the reduction factor of the telescopes is greater than 1, especially between 1.1 and 3. This range of reduction also proves to be advantageous for avoiding losses.

In particular, for the reduction factor I' of the telescopes can apply:

$$\Gamma = F_3/F_5 = R_3/R_5,$$

where $F_3$ is the focal length of the cylindrical lenses of the first array, $F_5$ is the focal length of the cylindrical lenses of the second array, $R_3$ is the radius of curvature of the cylindrical lenses of the first array and $R_5$ is the radius of curvature of the cylindrical lenses of the second array.

In order to achieve a reduction, the focal length of the cylindrical lenses of the first array is chosen to be longer than the focal length of the cylindrical lenses of the second array.

It may also be provided that the cylinder axes of the cylindrical lenses of the first and/or second array enclose an angle with the first direction (x) for which the following applies:

$$\gamma = \arctan(\sqrt{(\Gamma)})$$

Such a design, with a correspondingly large reduction factor, ensures that the laser radiation does not hit the spaces between the cylindrical lenses and neighboring lenses of the second array even for not perfectly collimated light at the entrance. Such a loss-reduced transformation simultaneously may provide mirroring of the cross-section of every partial beam passing the array lens pair with respect to the axes of the lens vertexes.

It is possible that the first and second arrays of cylindrical lenses are formed on one, especially monolithic, substrate. This results in a compact and robust design of the transformation device. Furthermore, any adjustment of the distance between the arrays of cylindrical lenses is not necessary.

Alternatively, the arrays can also be formed on different substrates. It is also possible to assemble the arrays from individual cylindrical lenses. Such a design may offer advantages e.g. with regard to manufacturing or thermal stability.

It may be provided that the cylindrical lenses of the first and/or second array are refractive lenses or gradient index lenses. Alternatively, diffractive designs are also conceivable.

According to claim 1, it is intended that the cylinder axes of the cylindrical mirrors of the first array enclose an angle greater than 45° and less than 90° with the first direction. In this alternative design the two arrays comprise cylindrical mirrors, especially concave cylindrical mirrors, instead of the cylindrical lenses. In this design with cylindrical mirrors, the characteristics of the dependent claims 2 to 9 can be realized analogously.

According to claim 11, it is intended that the cylinder axes of the cylindrical lenses of the first array enclose an angle greater than 45° and less than 90° with the first direction. In particular, the transformation device may be a transformation device according to the invention.

It is possible that the laser light source is designed as a semiconductor laser, in particular as a laser diode bar, for example as a laser diode bar with a plurality of emitters spaced at a distance of about 200 μm from each other. It may be provided that the laser device comprises at least one fast axis collimating lens which is arranged between the laser light source and the transformation device, in particular wherein the fast axis collimating lens collimates the laser radiation emitted by the laser light source in a second direction perpendicular to the first direction. For such a laser diode bar, the radiation light field of the plurality of the emitters can be symmetrized and its focusability improved by the transformation device with minimal light losses.

Alternatively, there is the possibility that the laser light source can emit multi-mode laser radiation in which both the beam quality factor with respect to the first direction perpendicular to the direction of propagation of the laser radiation is greater than 1, in particular greater than 2, and the beam quality factor with respect to a second direction perpendicular to the first direction, perpendicular to the direction of propagation, is greater than 1, in particular greater than 2, the arrays of the transformation device being designed and arranged in the laser device in such a way that the laser radiation impinging on the transformation device is transformed in such a way that the beam quality factor of the laser radiation is increased with respect to the first direction and the beam quality factor of the laser radiation is reduced with respect to the second direction. In particular, the laser light source can be a Nd-YAG laser or an excimer laser or a Diode Pumped Solid State (DPSS) laser, for example an ultraviolet DPSS laser. Also with such laser light sources, the beam-shaping losses can be reduced by the transformation device.

BRIEF DESCRIPTION OF FIGURES

Further features and advantages of the present invention will become clear on the basis of the following description of preferred exemplary embodiments with reference to the accompanying illustrations, in which.

In the figures, identical and functionally identical parts are marked with the same reference signs. Furthermore, Cartesian coordinate systems are inserted in some of the figures for better orientation.

DETAILED DESCRIPTION

Figure 1:
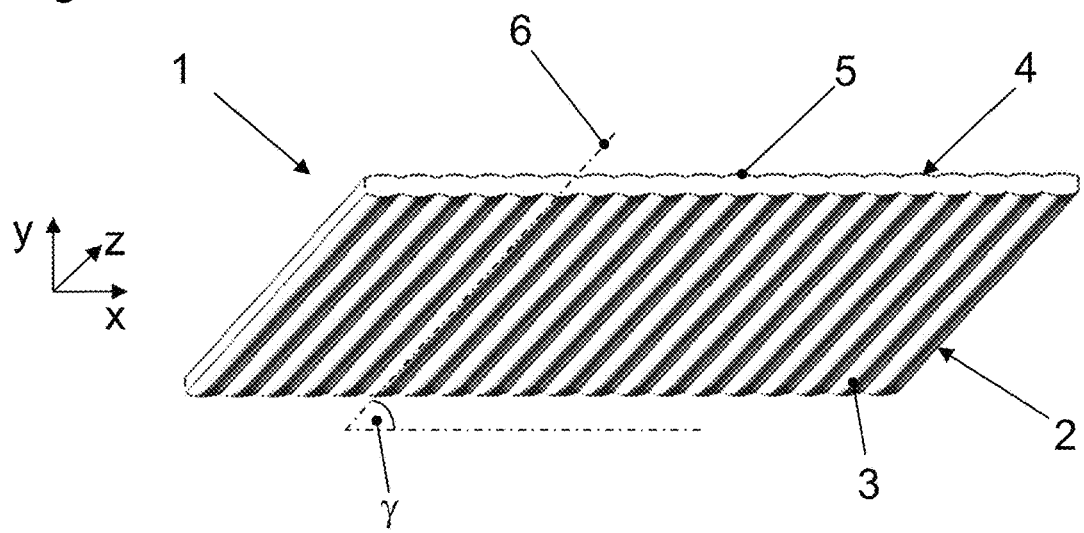
FIG. 1 shows a perspective view of an embodiment of a transformation device according to the invention.

The embodiment of a transformation device 1 according to the invention shown in FIG. 1 comprises a first array 2 of cylindrical lenses 3 which are arranged side by side in the first direction x, and a second array 4 of cylindrical lenses 5 which are also arranged side by side in the first direction x. The arrays 2, 4 are arranged on the front and back side of a substrate so that a cylindrical lens 3 of the first array 2 is opposite a cylindrical lens 5 of the second array 4. Here, the cylindrical lenses 3, 5 are monolithically formed on the substrate.

The cylindrical lenses 3, 5 of the first and second arrays 2, 4 are each oriented so that their cylinder axes 6 form an angle γ with the x-direction (see FIG. 1) which is greater than 45°, in particular between 46° and 60°. Furthermore, the focal lengths and radii of curvature of all cylindrical lenses 4 of the first array 2 are the same. Furthermore, the focal lengths and radii of curvature of all cylindrical lenses 5 of the second array 3 are also the same.

It is intended that during the operation of the transformation device 1 the laser radiation to be transformed passes first through the first array 2 and then through the second array 4, whereby the laser radiation is divided into a plurality of partial beams by the cylindrical lenses 3 of the first array 2. A partial beam passing through a cylindrical lens 3 of the first array 2 passes through the opposite cylindrical lens 5 of the second array 4.

Figure 6:
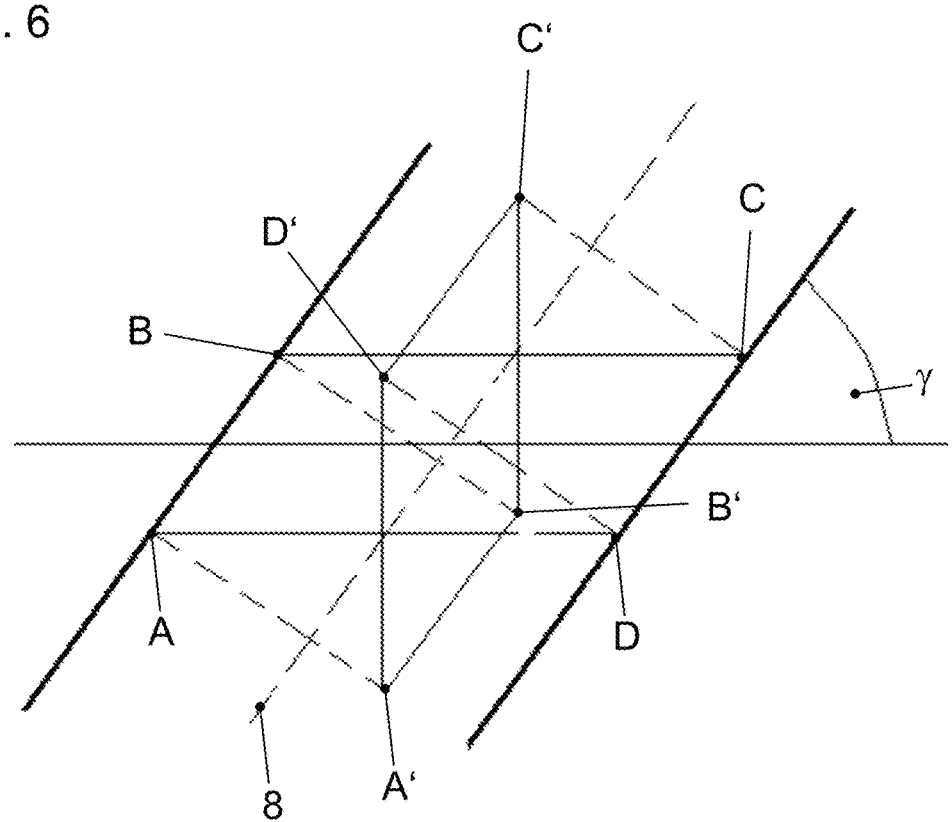
FIG. 6 shows a schematic front view of a detail of an embodiment of a transformation device according to the invention with a schematically indicated laser radiation.

The individual partial beams are transformed by the cylindrical lenses 3, 5 inclined against the x-direction in such a way that after passing through the transformation device 1 their cross-sections appear mirrored relative to corresponding vertex lines 8 of the cylindrical lenses 3, 5, like shown schematically in FIG. 6, wherein the input beam ABCD transforms into the output beam A'B'C'D'.

In the case of a laser radiation which is a multi-mode laser radiation and which has a beam quality factor $M_x^2$, $M_y^2$ greater than 2 with respect to both the first direction x and the second direction y, it can be achieved by the transformation that the beam quality factor $M_x^2$ of the laser radiation is increased with respect to the first direction x and the beam quality factor $M_y^2$ of the laser radiation is reduced with respect to the second direction y. Typical laser light sources for such laser radiation are for example a Nd-YAG laser or an excimer laser or an ultraviolet Diode Pumped Solid State (DPSS) laser.

The opposing cylindrical lenses 3, 5 of the first and second arrays 2, 4 each form a telescope, especially a Kepler telescope. The distance between the opposing cylindrical lenses 3, 5, which form a telescope, is equal to the sum of the focal lengths of these lenses.

Here, the focal lengths of the cylindrical lenses 3 of the first array 2 are larger than the focal lengths of the cylindrical lenses 5 of the second array 4, making the telescopes formed by the opposing cylindrical lenses 3, 5 reducing telescopes. The reduction factor Γ of the telescopes is greater than 1, especially between 1.1 and 3.

Figure 7:
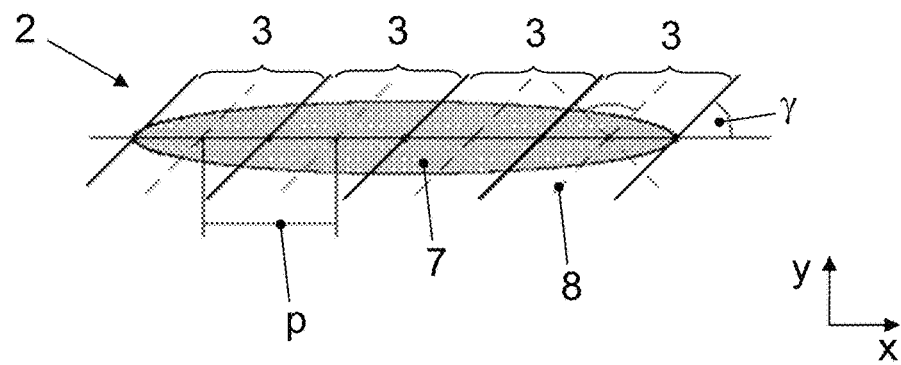
FIG. 7 shows a front view of a detail of a first array of an embodiment of a transformation device according to the invention with a schematically indicated laser radiation.

FIG. 7 illustrates schematically the impingement of a laser radiation 7 on the first array 2 of cylindrical lenses 3, whereby for the sake of simplicity only four cylindrical lenses 3 are indicated here. The laser radiation 7 has an elongated oval cross-section. With p the distance of the vertex lines 8 of adjacent cylindrical lenses 3 is marked. The laser beam 7 is divided by the first array 2 into a plurality of partial beams 7a, 7b, 7c, 7d.

Figure 8:
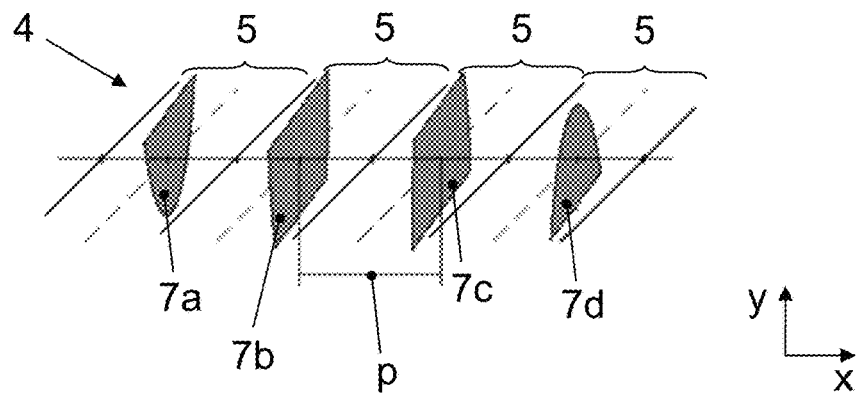
FIG. 8 shows a front view of a detail of a second array of the transformation device according to FIG. 6 with the schematically indicated laser radiation.

FIG. 8 shows the impingement of these partial beams 7a, 7b, 7c, 7d on the second array 4 of cylindrical lenses 5. It can be seen that the partial beams 7a, 7b, 7c, 7d are mirrored with regard to the vertex lines 8 and reduced in size according to the reduction factor Γ. This reduction contributes to the fact that the partial beams 7a, 7b, 7c, 7d do not impinge in the transition area between individual cylindrical lenses 5 and neighboring lenses of the second array 4.

Figure 4:
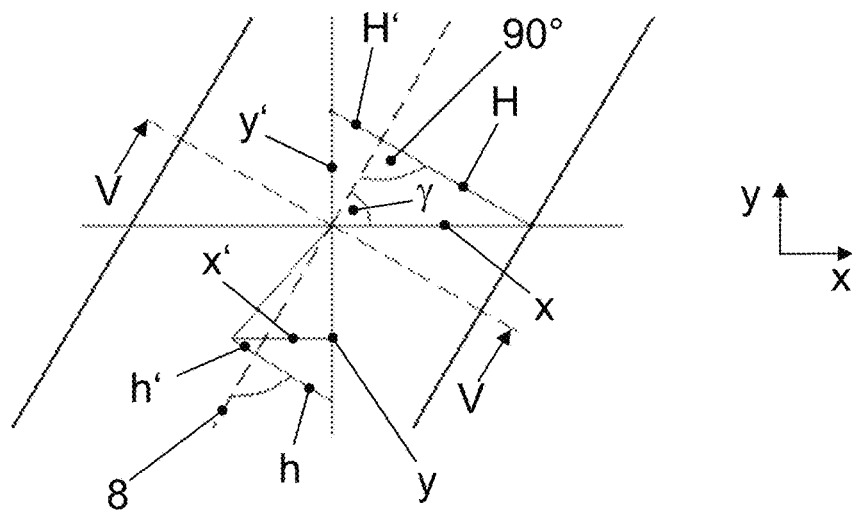
FIG. 4 shows a schematic front view of a detail of an embodiment of a transformation device according to the invention with a schematically indicated laser radiation.
Figure 5:
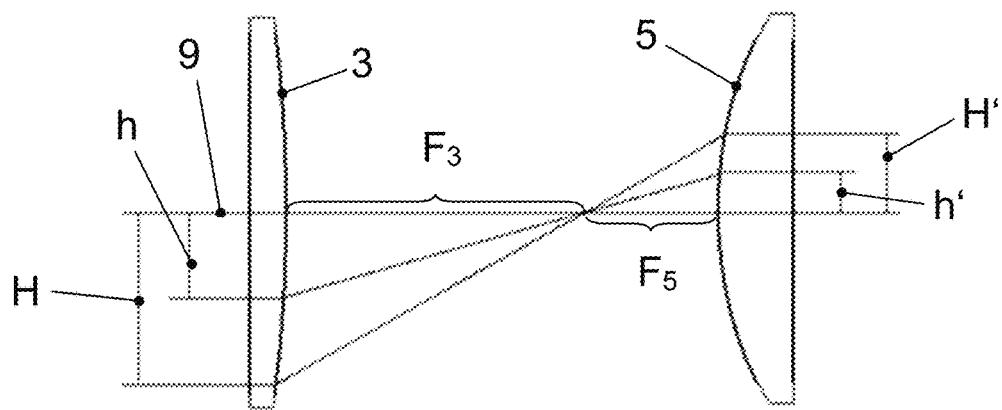
FIG. 5 shows a schematic section according to the arrows V-V in FIG. 4.

FIG. 4 and FIG. 5 illustrate how individual beams of the laser radiation are transformed by the transformation device 1. One of the telescopes is only shown schematically. The cylindrical lenses 3, 5 are drawn as separate lenses for clarification. However, they can be formed by the entrance surface and the exit surface of a monolithic substrate as shown in FIG. 1.

It can be seen from FIG. 5 that the focal length $F_3$ of the cylindrical lenses 3 of the first array 2 is greater than the focal length $F_5$ of the cylindrical lenses 5 of the second array 4, and accordingly a beam entering the cylindrical lens 3 of the first array 2 at a distance H from the optical axis 9 after passing through the cylinder lens 5 of the second array 4 will have a smaller distance H' from the optical axis 9. The same applies to a beam entering the cylindrical lens 3 of the first array 2 at a smaller distance h from the optical axis 9. FIG. 5 shows that after passing through the cylindrical lens 5 of the second array 4, this beam has an even smaller distance h' to the optical axis 9. FIG. 4 shows these conditions in the front view.

Accordingly, the following applies $$\Gamma = H/H' = h/h' = R_3/R_5 = F_3/F_5,\qquad\text{[equation 1]}$$

where $R_3$ are the radii of the cylindrical lenses 3 of the first array 2 and $R_5$ are the radii of the cylindrical lenses 5 of the second array 4. The radii $R_3$, $R_5$ of the cylindrical lenses 3, 5 can be of several millimeters when using the transformation device for anisotropic beam shaping to generate a laser line.

With the aid of FIG. 4, a relationship between the angle γ and the reduction factor Γ of the telescope can be derived. It can be seen that $\tan(\gamma)=\sqrt{\Gamma}$ is for Γ>0. From this follows for the angle γ:

$$\gamma = \arctan(\sqrt{(\Gamma)})\qquad\text{[equation 2]}$$

The simultaneous satisfaction of the equation 1 and 2 provides mirroring of the outcoming partial beam cross-sections with regard to the vertex lines 8 of the cylindrical lenses 3, 5.

From FIG. 4 it can further be derived that a beam which has an extension in x-direction of x on the cylindrical lens 3 of the first array 2 has an extension in y-direction of y' on the cylindrical lens 5 of the second array 4 (see FIG. 4). For y' applies then:

$$y' = \frac{x}{\tan(\gamma)} = \frac{x}{\sqrt{\Gamma}}\qquad\text{[equation 3]}$$

Accordingly, it can be further derived from FIG. 4 that a beam which has an extension in y-direction of y on the cylinder lens 3 of the first array 2 has an extension in x-direction of x' on the cylinder lens 5 of the second array 4 (see FIG. 4). For x' applies then:

$$x' = \frac{y}{\tan(\gamma)} = \frac{y}{\sqrt{\Gamma}}\qquad\text{[equation 4]}$$

It can be seen from the equations that the height and width of the segment at the output of the transformation device decrease by tan(γ) times, provided that Γ>1.

From these considerations, the working principle of the transformation device on an incident intensity distribution could be also described in the context of affine maps, which preserve the following properties:
1. collinearity
2. parallelism
3. convexity of sets
4. ratios of lengths along a line
5. barycenters of weighted collections of points.

The affine map of the transformation device should be denoted $\mathcal{F}_\omega(\Gamma)\in\mathbb{R}^2$ in image space and $\mathcal{F}_\theta(\Gamma)\in\mathbb{R}^2$ in angular space and reads as follows:

$$F_\omega(\Gamma)=R(\Gamma)^T\cdot S(\Gamma)\cdot R(\Gamma)$$

$$F_\theta(\Gamma) = R(\Gamma)^T \cdot S^{-1}(\Gamma) \cdot R(\Gamma), \quad \text{[equation 5]}$$

where $$\mathcal{R}(\Gamma) = \begin{pmatrix} \cos[\gamma] & \sin[\gamma] \\ -\sin[\gamma] & \cos[\gamma] \end{pmatrix}$$

$$= \begin{pmatrix} \cos[\arctan(\sqrt{\Gamma})] & \sin[\arctan(\sqrt{\Gamma})] \\ -\sin[\arctan(\sqrt{\Gamma})] & \cos[\arctan(\sqrt{\Gamma})] \end{pmatrix}$$

$$S(\Gamma) = \begin{pmatrix} 1 & 0 \\ 0 & -\frac{1}{\Gamma} \end{pmatrix}. \quad \text{[equation 6]}$$

Here, the $S(\Gamma) \in \mathbb{R}^2$ represents a scaling operation with respect to the y-axis. For mirroring and scaling with respect to the vertex line 8 a basis transformation is required, which is given by the well-known 2D rotation matrices $\mathcal{R}(\Gamma)$. Furthermore, scaling in angular and image space exhibit an inverted behavior and hence $S(\Gamma)$ has to be inverted.

After a short simplifying calculation, this transforms into:

$$F_\omega(\Gamma) = \begin{pmatrix} -\frac{1}{\Gamma}\sin(\gamma)^2 + \cos(\gamma)^2 & \frac{1}{\Gamma}\sin(\gamma)\cos(\gamma) + \sin(\gamma)\cos(\gamma) \\ \frac{1}{\Gamma}\sin(\gamma)\cos(\gamma) + \sin(\gamma)\cos(\gamma) & -\frac{1}{\Gamma}\cos(\gamma)^2 + \sin(\gamma)^2 \end{pmatrix}$$

$$= \begin{pmatrix} 0 & \frac{1}{\sqrt{\Gamma}} \\ \frac{1}{\sqrt{\Gamma}} & 1 - \frac{1}{\Gamma} \end{pmatrix},$$

$$F_\theta(\Gamma) = \begin{pmatrix} 1-\Gamma & \sqrt{\Gamma} \\ \sqrt{\Gamma} & 0 \end{pmatrix} \quad \text{[equation 7]}$$

Consequently equations (3) and (4) are special cases of input vectors along the coordinate vectors and are obtained by:

$$r' = \begin{pmatrix} x' \\ y' \end{pmatrix} = \mathcal{F}_\omega(\Gamma)\begin{pmatrix} x \\ 0 \end{pmatrix} = \begin{pmatrix} 0 \\ \frac{x}{\sqrt{\Gamma}} \end{pmatrix}$$

$$r' = \begin{pmatrix} x' \\ y' \end{pmatrix} = F_\omega(\Gamma)\begin{pmatrix} 0 \\ y \end{pmatrix} = \begin{pmatrix} \frac{y}{\sqrt{\Gamma}} \\ y\left(1 - \frac{1}{\Gamma}\right) \end{pmatrix}. \quad \text{[equation 8]}$$

Figure 2:
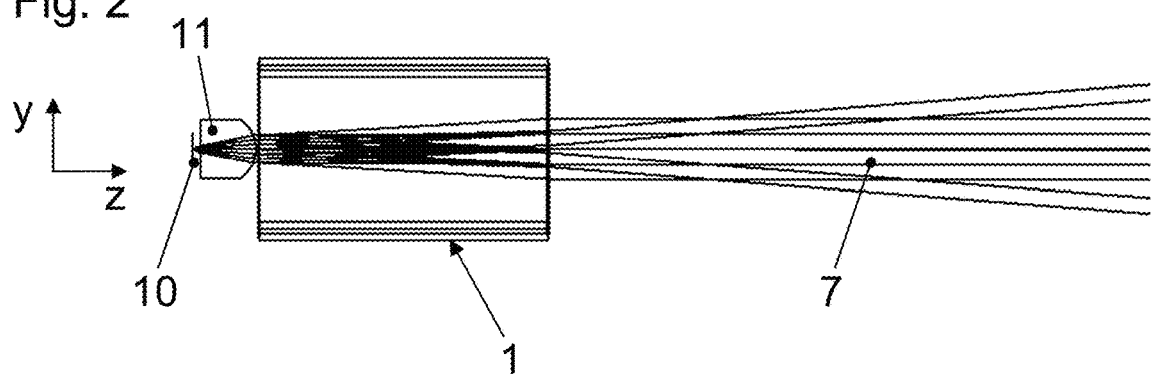
FIG. 2 shows a schematic side view of an embodiment of a laser device according to the invention.
Figure 3:
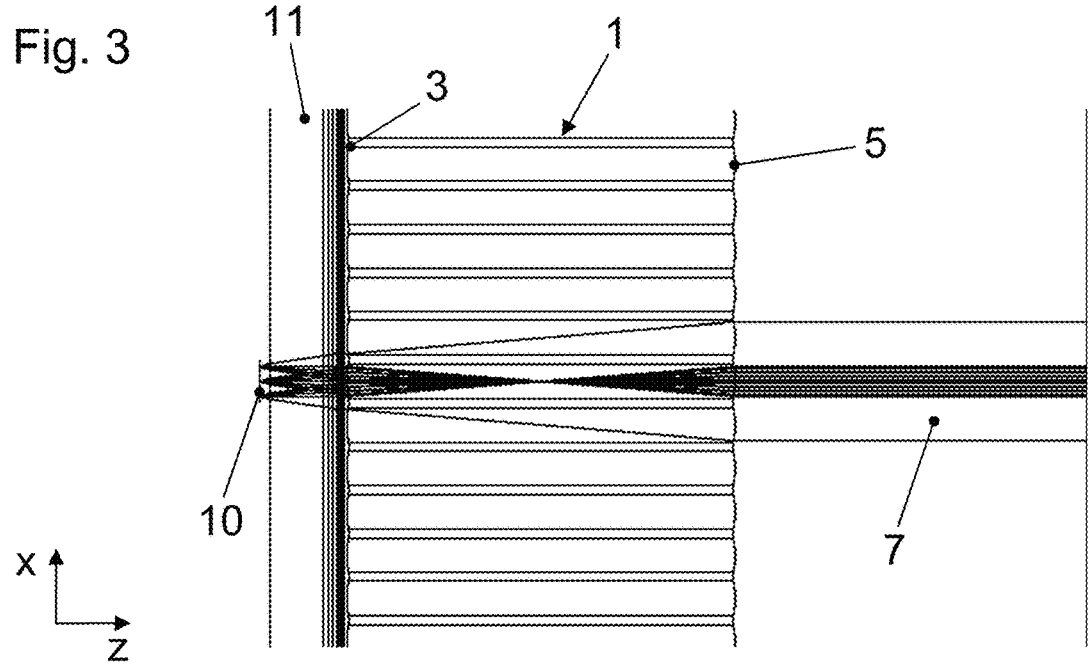
FIG. 3 shows a top view of the laser device according to FIG. 2.

In FIG. 2 and FIG. 3 a laser device is shown which comprises a laser diode bar as laser light source 10. In the top view according to FIG. 3 only three emitters of this laser diode bar are shown. The laser diode bar, for example, can be a high-power bar with 22 emitters and a wavelength of 980 nm. The individual emitters can each be 130 µm in size in the slow-axis direction, which corresponds to the x-direction in the example shown. The individual emitters can each be 1.6 µm in size in the fast axis direction, which corresponds to the y direction in the example shown. The individual emitters can have a pitch of 200 µm in the slow axis direction or the x-direction. The numerical aperture in the slow-axis direction or the x-direction can be ±4.25°. The numerical aperture in the fast axis direction or the y-direction can be ±24.5°.

The laser device further comprises a fast axis collimating lens 11 between the laser light source 10 and the transformation device 1. The fast axis collimating lens 11 collimates the laser radiation 7 emitted by the individual emitters in the y-direction or in the fast axis direction. For example, the fast axis collimating lens 11 can have a focal length of 0.16 mm.

For use with such laser diode bars, the radii of the cylindrical lenses 3, 5 of the transformation device 1 can be about 0.2 to 1.5 mm.

By the described design of the transformation device 1, even when using a laser diode bar as laser light source 10 losses can be reduced by not impinging laser radiation into the regions of adjacent cylinder lenses 5 of the second array 4.

The invention claimed is:

1. Transformation device for laser radiation, comprising a first array of cylindrical lenses arranged side by side in a first direction (x) and a second array of cylindrical lenses arranged side by side in the first direction (x), wherein during operation of the transformation device, the laser radiation first passes through the first array and then through the second array, and wherein in each case one of the cylindrical lenses of the first array is associated with one of the cylindrical lenses of the second array in such a way that an array of reducing telescopes results, characterized in that cylinder axes of the cylindrical lenses of the first array enclose an angle (γ) greater than 45° and less than 90° with the first direction (x); wherein the reduction factor (I) of the telescopes is greater than 1.

2. Transformation device according to claim 1, characterized in that cylinder axes of the cylindrical lenses of the second array are parallel to the cylinder axes of the cylindrical lenses of the first array.

3. Transformation device according to claim 1, characterized in that the cylinder axes of the cylindrical lenses of the first and/or second array enclose an angle (γ) greater than 46° and less than 60° with the first direction (x).

4. Transformation device according to claim 1, characterized in that all cylindrical lenses of the first array have the same focal lengths ($F_3$) and/or the same radii of curvature ($R_3$) and/or that all cylindrical lenses of the second array have the same focal lengths ($F_5$) and/or the same radii of curvature ($R_5$).

5. Transformation device according to claim 1, characterized in that for the reduction factor (Γ) of the telescopes the following applies $$\Gamma = F_3/F_5 = R_3/R_5,$$

where
$F_3$ is the focal length of the cylindrical lenses of the first array,
$F_5$ is the focal length of the cylindrical lenses of the second array,
$R_3$ is the radius of curvature of the cylindrical lenses of the first array and
$R_5$ is the radius of curvature of the cylindrical lenses of the second array.

6. Transformation device according to claim 1, characterized in that the cylinder axes of the cylindrical lenses of the first and/or second array enclose an angle (y) with the first direction (x), for which the following applies:

$$\gamma = \arctan(\sqrt{(\Gamma)}).$$

7. Transformation device according to claim 1, characterized in that the first and second arrays of cylindrical lenses are formed on one substrate.

8. Transformation device according to claim 1, characterized in that the cylindrical lenses of the first and/or the second array are refractive lenses or gradient index lenses.

9. Transformation device according to claim 1, wherein the reduction factor (Γ) is between 1.1 and 3.

10. Transformation device for laser radiation, comprising a first array of cylindrical mirrors arranged side by side in a first direction and a second array of cylindrical mirrors arranged side by side in the first direction, wherein during operation of the transformation device the laser radiation first is reflected by the first array and then reflected by the second array, and wherein in each case one of the cylindrical mirrors of the first array is associated with one of the cylindrical mirrors of the second array in such a way that an array of reducing telescopes results, characterized in that the cylinder axes of the cylindrical mirrors of the first array enclose an angle ($\gamma$) greater than 45° and less than 90° with the first direction;

wherein the laser light source is configured to emit multi-mode laser radiation in which both the beam quality factor (Mx2) with respect to the first direction (x) perpendicular to the direction of propagation (z) of the laser radiation is greater than 1, and the beam quality factor (My2) with respect to the second direction (y) perpendicular to the direction of propagation (z) is greater than 1, the arrays of the transformation device being in the laser device in such a way that the laser radiation impinging on the transformation device is transformed in such a way that the beam quality factor (Mx2) of the laser radiation is increased with respect to the first direction (x) and the beam quality factor (My2) of the laser radiation is reduced with respect to the second direction (y).

11. Laser device according to claim 1, characterized in that the laser device comprises at least one fast axis collimating lens which is arranged between the laser light source and the transformation device.

12. Laser device according to claim 1, characterized in that the laser light source is a Nd-YAG laser or an excimer laser or as an ultraviolet Diode Pumped Solid State (DPSS) laser.

13. Laser device according to claim 11, wherein the fast axis collimating lens collimates the laser radiation emitted by the laser light source in a second direction (y) perpendicular to the first direction (x).

14. Laser device according to claim 1, wherein the beam quality factor ($M_x^2$) is greater than 2 or the beam quality factor ($M_y^2$) is greater than 2.

15. Laser device comprising
a laser light source which emits laser radiation during operation of the laser device,
a transformation device for the laser radiation emanating from the laser light source, having a first array of cylindrical lenses or cylindrical mirrors which are arranged next to one another in the first direction (x), and a second array of cylindrical lenses or cylindrical mirrors which are arranged next to one another in the first direction (x), in each case one of the cylindrical lenses or the cylindrical mirrors of the first array being assigned in this way to one of the cylindrical lenses or the cylindrical mirrors of the second array, that a partial beam of the laser radiation passing through a cylindrical lens of the first array or being reflected by the cylindrical mirrors of the first array passes at least substantially through the associated cylindrical lens of the second array or being at least substantially reflected by the cylindrical mirrors of the second array, and wherein the cross-section of this partial beam on the cylindrical lens or the cylindrical mirror of the first array is larger than the cross-section of the partial beam on the associated cylindrical lens or the cylindrical mirror of the second array, characterized in that the cylinder axes of the cylindrical lenses or the cylindrical mirrors of the first array enclose an angle ($\gamma$) greater than 45° and less than 90° with the first direction (x);

wherein the laser light source is configured to emit multi-mode laser radiation in which both the beam quality factor ($M_x^2$) with respect to the first direction (x) perpendicular to the direction of propagation (z) of the laser radiation is greater than 1, and the beam quality factor ($M_y^2$) with respect to the second direction (y) perpendicular to the direction of propagation (z) is greater than 1, the arrays of the transformation device being in the laser device in such a way that the laser radiation impinging on the transformation device is transformed in such a way that the beam quality factor ($M_x^2$) of the laser radiation is increased with respect to the first direction (x) and the beam quality factor ($M_y^2$) of the laser radiation is reduced with respect to the second direction (y).

16. Laser device according to claim 15, characterized in that the laser light source is a semiconductor laser.

17. Laser device according to claim 16, wherein the laser light source is a laser diode bar.

18. Laser device according to claim 17, wherein the laser diode bar comprises a plurality of emitters spaced from one another.

* * * * *